United States Patent [19]
Linliu

[11] Patent Number: 6,033,966
[45] Date of Patent: Mar. 7, 2000

[54] METHOD FOR MAKING AN 8-SHAPED STORAGE NODE DRAM CELL

[75] Inventor: Kung Linliu, Hsinchu, Taiwan

[73] Assignee: Worldwide Seminconductor Manufacturing Corporation, Hsinchu, Taiwan

[21] Appl. No.: 09/189,066

[22] Filed: Nov. 9, 1998

[51] Int. Cl.[7] .................................................. H01L 21/20
[52] U.S. Cl. ............................................ 438/396; 438/253
[58] Field of Search .................................... 438/253, 254, 438/255, 256, 396, 397, 398, 399

[56] References Cited

U.S. PATENT DOCUMENTS

| | | | |
|---|---|---|---|
| 5,444,005 | 8/1995 | Kim et al. | 438/396 |
| 5,604,146 | 2/1997 | Tseng | 438/253 |
| 5,710,073 | 1/1998 | Jeng et al. | 438/239 |
| 5,712,202 | 1/1998 | Liaw et al. | 438/255 |

*Primary Examiner*—Tuan H. Nguyen
*Attorney, Agent, or Firm*—Blakely Sokoloff Taylor & Zafman

[57] ABSTRACT

A method for manufacturing an 8-shaped bottom storage node. A dielectric layer and a polysilicon layer are deposited. A bit line contact and a storage node contact are formed through the dielectric layer and the polysilicon layer down to an access transistor. After formation of the bit line contact and the storage node contact, the polysilicon layer is removed leaving the first dielectric layer. A polysilicon layer is deposited over the dielectric layer and into the bit line contact and storage node contacts. This is followed by a deposition of a tungsten silicide layer and a second dielectric layer. These layers are then etched to form a bit line above the bit line contact. Sidewall spacers are formed on the sidewalls of the bit line. Another polysilicon layer is deposited into the storage node contacts and above the bit line. This polysilicon layer is patterned and etched in an 8 pattern. Oxide spacers are formed on the sidewalls of the etched polysilicon layer. Next, using the oxide spacers and oxide as a hard mask, the polysilicon layer is etched until the top of the bit line is reached. Finally, the oxide spacers are removed and an 8 shaped storage node is formed.

5 Claims, 5 Drawing Sheets

METHOD FOR MAKING AN 8-SHAPED STORAGE NODE DRAM CELL

FIELD OF THE INVENTION

The present invention relates to a method for manufacturing dynamic random access memory (DRAM), and more specifically, to a method for manufacturing an 8-shaped storage node of a capacitor for DRAM memory.

BACKGROUND OF THE INVENTION

It has been the trend to scale down the sizes of memory cells to increase the integration level and thus memory capacity of a DRAM chip. As the size of DRAMs is decreased, the capacity of the capacitor used in the DRAM is correspondingly decreased.

A memory cell of DRAM typically consists of a storage capacitor and an access transistor. With the advent of large-scale integrated DRAM devices, the size of the devices has gotten smaller and smaller such that the available area for a single memory cell has become very small. This causes a reduction in the capacitor's area, resulting in the reduction of the cell's capacitance.

Prior art methods for manufacturing a capacitor with increased area include methods for manufacturing stack capacitors and crown capacitors. However, it is desirable to have a new method for manufacturing a capacitor with even more area and with a structure that is stronger than previous crown capacitors.

SUMMARY OF THE INVENTION

A method for manufacturing an 8-shaped bottom storage node is disclosed. First, a dielectric layer and a polysilicon layer are deposited over a substrate. A bit line contact and a storage node contact are formed through the dielectric layer and the polysilicon layer down to an access transistor. Sidewall spacers are formed in the contacts. After formation of the bit line contact and the storage node contact, the polysilicon layer is removed leaving the first dielectric layer.

A second polysilicon layer is then deposited over the dielectric layer and into the bit line contact and storage node contact. This is followed by a deposition of a tungsten silicide layer and a second dielectric layer. These layers are then etched to form a bit line above the bit line contact. Sidewall spacers are formed on the sidewalls of the bit line. A third polysilicon layer is deposited into the storage node contacts and above the bit line. This third polysilicon layer is patterned and etched in a 8 pattern. Oxide spacers are formed on the sidewalls of the etched polysilicon layer. Next, using the oxide spacers and oxide as a hard mask, the polysilicon layer is etched until the top of the bit line is reached. Finally, the oxide spacers are removed and an 8 shaped storage node is formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
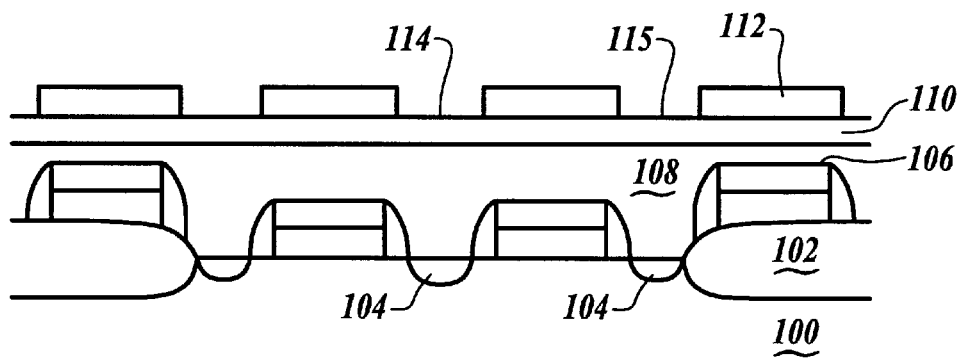
FIGS. 1–10 show cross-sectional views of a semiconductor substrate, showing the steps of forming a DRAM cell in accordance with the present invention.

Referring to FIG. 1, a single crystal P-type substrate 100 is used for the preferred embodiment. A thick field oxide region (FOX) 102, is created using conventional methods for the purposes of isolation. Generally speaking, the FOX 102 region is created via photolithography and dry etching steps to etch a silicon nitride/silicon dioxide composite layer. After the photoresist is removed and wet cleaned, a thermo-oxidation in an oxygen-steam ambient is used to form the FOX 102 region, to a thickness of about 3,000 to 8,000 angstroms. Source and drain regions 104 are formed in the substrate 100 and gates 106 are created atop the substrate. These steps are well-known in the art and will not be discussed further herein.

Figure 2:
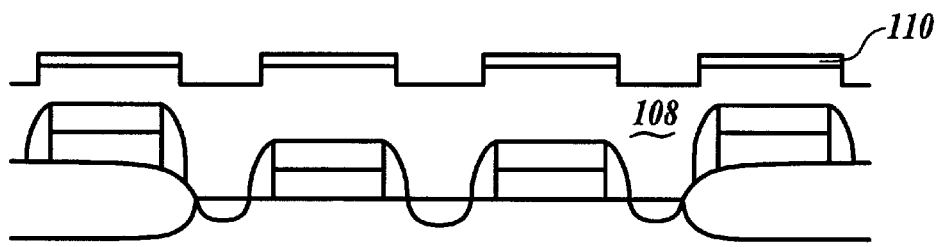

Still referring to FIG. 1, an insulative silicon oxide layer 108 is deposited by using LPCVD. Next, a polysilicon layer 110 is deposited over the silicon oxide layer 108. In the preferred embodiment, the polysilicon layer 110 is deposited by conventional chemical vapor deposition (CVD). The polysilicon layer 110 has a thickness of about 500 to 2000 angstroms in the preferred embodiment. A photoresist mask layer 112 is deposited over the polysilicon layer 110. The photoresist mask layer is patterned and developed to expose a bit line contact 114 and a storage node contact 115. An anisotropic etching step is used to etch the polysilicon layer 110 and the oxide layer 108 and is controlled to stop about 300 to 1000 angstroms into the silicon oxide layer 108. After stripping of the photoresist 112, the resulting structure is shown in FIG. 2.

Figure 3:
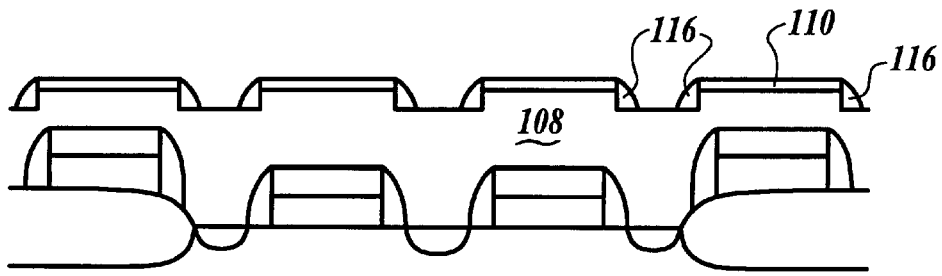

Referring to FIG. 3, another polysilicon layer is deposited by conventional CVD and is anisotropically etched to form polysilicon spacers 116 along the side walls of the polysilicon layer 110 and the oxide layer 108.

Figure 4:
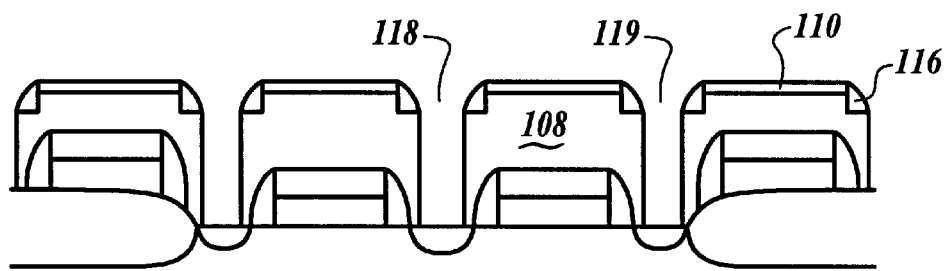

Referring to FIG. 4, using the polysilicon spacers 116 and the polysilicon layer 110 as a mask, the oxide layer 108 is etched until the substrate 100 is reached to form a bit line contact opening 118 and a storage node contact opening 119.

Figure 5:
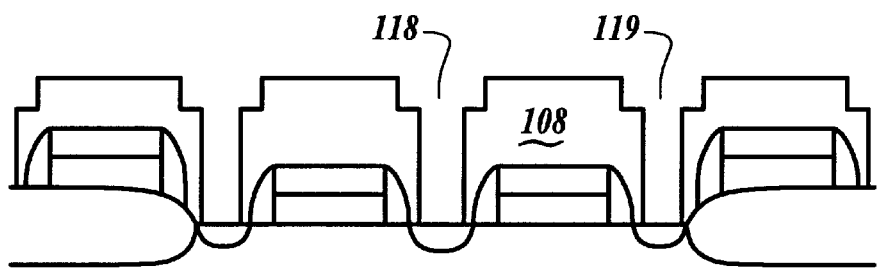

Referring to FIG. 5, the polysilicon layer 110 and polysilicon spacers 116 are removed by any conventional dry or wet etching process.

Figure 6:
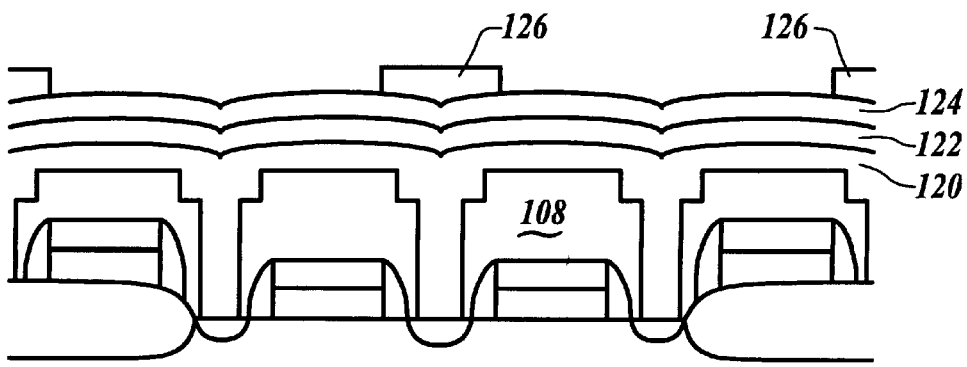

Referring to FIG. 6, a polysilicon layer 120 is deposited over the oxide layer 108 and into the bit line contact opening 118 and the storage node contact opening 119. In the preferred embodiment, the polysilicon layer 120 is deposited by CVD. The polysilicon layer 120 has a thickness of about 1000 to 2000 angstroms in the preferred embodiment. A tungsten silicide layer 122 is then deposited onto the polysilicon layer 120 by CVD and is preferably about 1000 to 2000 angstroms thick. Then, a silicon nitride or silicon oxide layer 124 is deposited onto the tungsten silicide layer 122 by LPCVD and is preferably about 1000 to 3000 angstroms thick. A photoresist mask layer 126 is deposited over the silicon nitride or silicon oxide layer 124. The photoresist mask layer 126 is patterned and developed, resulting in the structure shown in FIG. 6.

Figure 7:
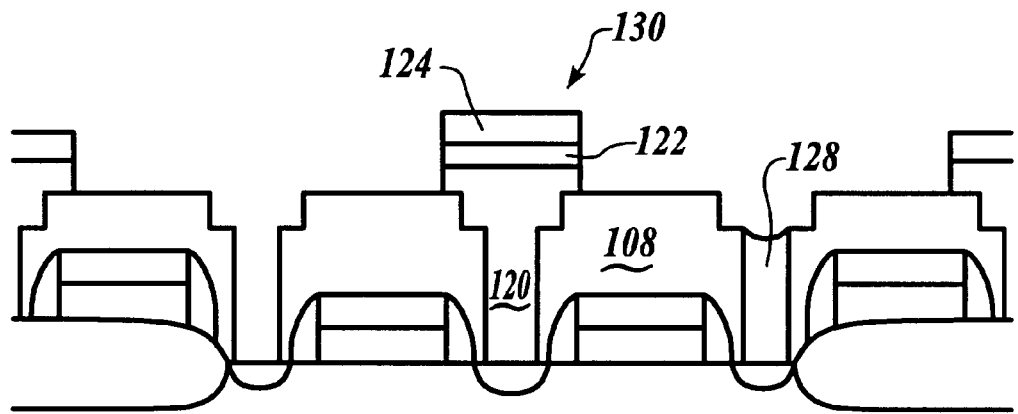

Referring to FIG. 7, the silicon nitride or silicon oxide layer 124, the tungsten silicide layer 122, and the polysilicon layer 120 are etched until the silicon oxide layer 108 is reached. This etching creates a polysilicon plug 128 in the storage node contact opening 119 and an intermediate structure 130 above the bit line contact opening 118.

Figure 8:
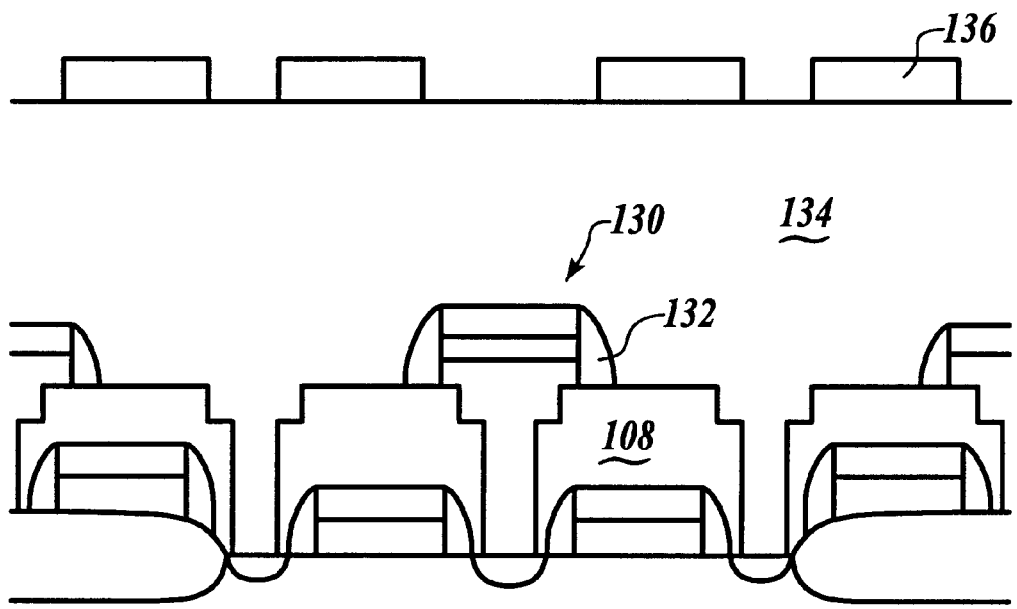

Referring to FIG. 8, using conventional photolithography and anisotropic etching techniques (such as reactive ion etching), silicon nitride or silicon oxide spacers 132 are formed on the sidewalls of the intermediate structure 130. Next, a polysilicon layer 134 is deposited by using CVD. The polysilicon layer 134 is preferably about 6000 to 10000 angstroms thick. A photoresist mask layer 136 is deposited over the polysilicon layer 134. The photoresist mask layer 136 is patterned and developed, resulting in the structure shown in FIG. 8.

Figure 9:
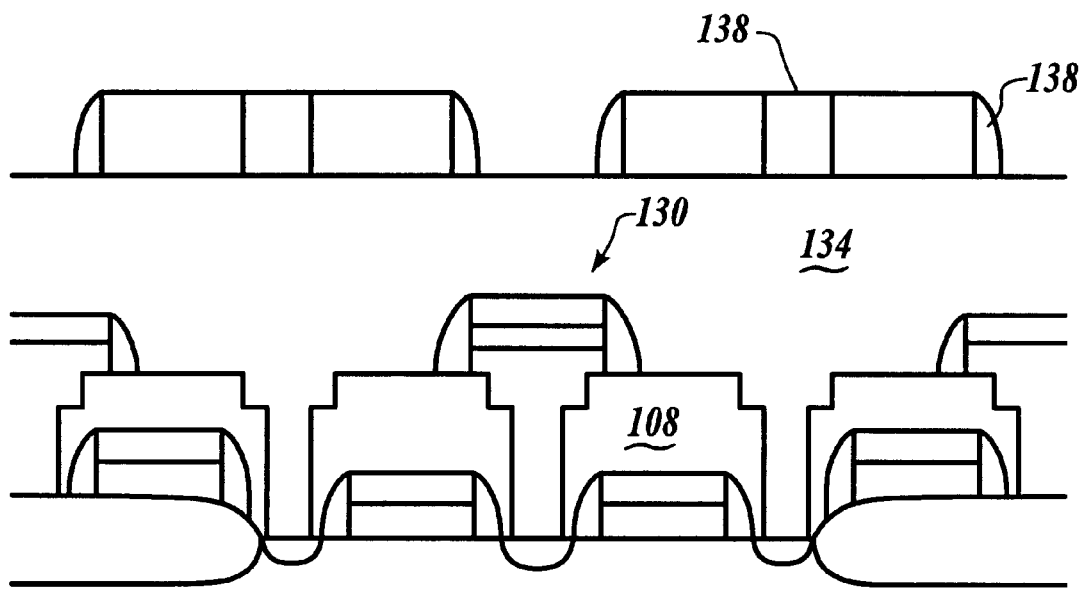

Referring to FIG. 9, using the photoresist layer 136 as a mask, the polysilicon layer 134 is etched and is controlled to stop preferably 500 to 3000 angstroms into the polysilicon layer 134. Then, the photoresist layer 136 is removed. Silicon dioxide is deposited and silicon oxide spacers 138 are formed on the sidewalls of the polysilicon layer 134 by reactive ion etching.

Figure 10:
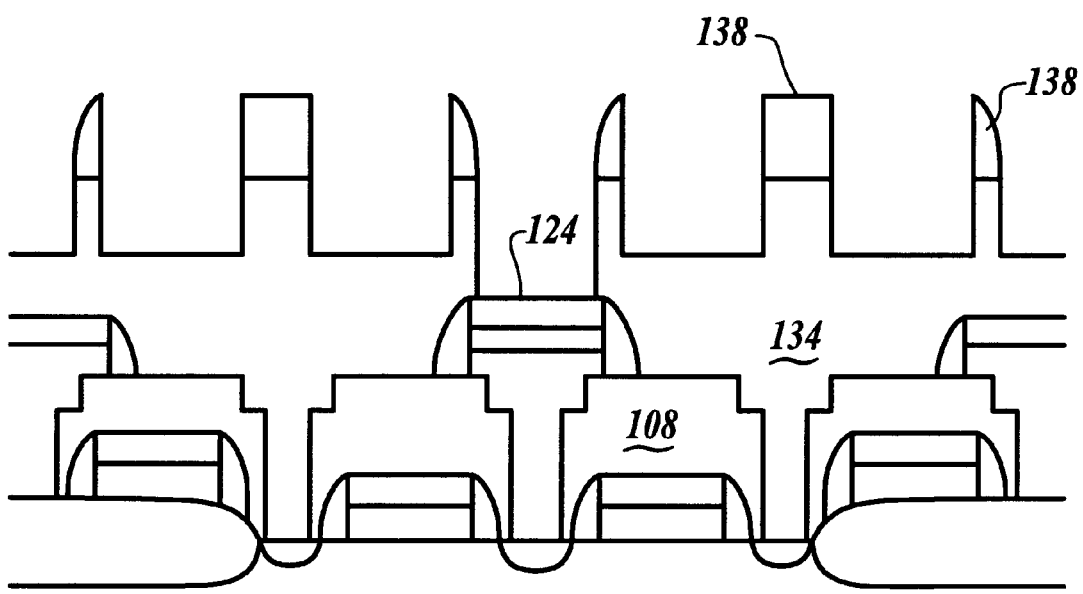

Turning to FIG. 10, the polysilicon layer 134 is etched using the oxide spacers 138 as a hard mask. The etching is stopped at the silicon oxide or silicon nitride layer 124. The oxide spacers 138 are then removed. In this manner, the 8-shaped bottom storage node of the capacitor is formed.

Figure 11A:
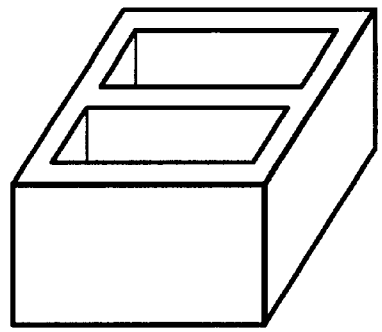
FIG. 11A shows a perspective view of a bottom storage node in accordance with the present invention.
Figure 11B:
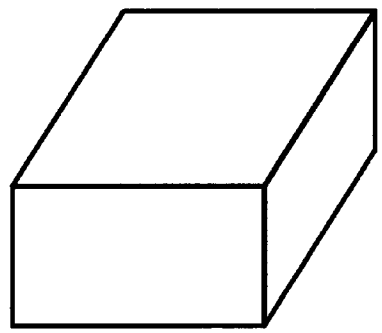
FIGS. 11B and 11C show perspective views of a prior art stack storage node and a prior art crown storage node, respectively.
Figure 11C:
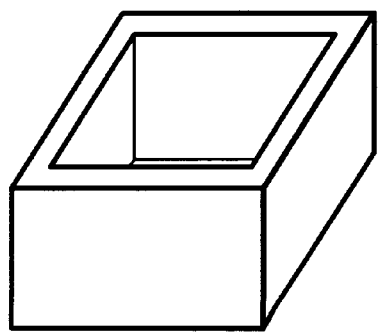

As is readily seen in FIG. 11A, an 8-shaped bottom storage node according to the present invention has increased surface area by which to store charge. The 8-shaped storage node shown in FIG. 11A has more surface area than previously used stack and crown storage nodes shown in FIGS. 11B and 11C, respectively. In addition, the 8-shaped storage node is stronger than the crown-shaped storage node as a result of its structure.

Finally, a thin dielectric layer is typically deposited over the bottom storage node and a plate polysilicon layer is deposited to form the upper storage node of the capacitor. These conventional "finishing" steps are known in the art and will not be discussed further herein.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a bottom storage node of a capacitor on a substrate, the method comprising the steps of:

forming a first dielectric layer onto said substrate;

forming a first conducting layer onto said first dielectric layer;

patterning and etching said first dielectric layer and said first conducting layer, stopping within said first dielectric layer, to form a bit line contact and a storage node contact;

forming first sidewall spacers on the sides of said first dielectric layer and said first conducting layer;

using said first sidewall spacers and said first conducting layer as a mask, etching through said first dielectric layer to form a bit line contact opening and a storage node contact opening;

removing said first sidewall spacers and said first conducting layer;

forming a second conducting layer onto said first dielectric layer and into said bit line contact opening and said storage node contact opening;

forming a third conducting layer onto said second conducting layer;

forming a second dielectric layer onto said third conducting layer;

patterning and etching said second conducting layer, said third conducting layer, and said second dielectric layer to form a plug in said storage node contact opening and to form an intermediate structure above said bit line contact opening;

forming second sidewall spacers on the sides of said intermediate structure;

forming a fourth conducting layer onto said second dielectric layer, said second sidewall spacers, said plug and said first dielectric layer;

patterning and etching portions of said fourth conducting layer directly above said bit line contact opening and said storage node opening, stopping within said fourth conducting layer, said patterning and etching resulting in said fourth conducting layer being formed into an 8-shape;

forming third sidewall spacers on the sides of said fourth conducting layer;

using said third sidewall spacers as a mask, etching said fourth conducting layer, stopping at said intermediate structure; and removing said third sidewall spacers.

2. The method of claim 1, wherein said first dielectric layer is formed of silicon oxide.

3. The method of claim 1, wherein said first conducting layer, said second conducting layer, and said fourth conducting layer are formed of polysilicon.

4. The method of claim 1, wherein said second dielectric layer is selected from a group consisting of silicon nitride or silicon oxide.

5. The method of claim 1, wherein said third conducting layer is formed of tungsten silicide.

* * * * *